United States Patent
Mallikarjunaswamy et al.

(10) Patent No.: US 7,087,973 B2
(45) Date of Patent: Aug. 8, 2006

(54) BALLAST RESISTORS FOR TRANSISTOR DEVICES

(75) Inventors: Shekar Mallikarjunaswamy, San Jose, CA (US); Martin J. Alter, Los Altos, CA (US); Charles L. Vinn, Milpitas, CA (US)

(73) Assignee: Micrel, Incorporated, San Jose, CA (US)

( * ) Notice: Subject to any disclaimer, the term of this patent is extended or adjusted under 35 U.S.C. 154(b) by 123 days.

(21) Appl. No.: 10/405,253

(22) Filed: Apr. 1, 2003

(65) Prior Publication Data

US 2004/0195644 A1   Oct. 7, 2004

(51) Int. Cl.
*H01L 23/58* (2006.01)
*H01L 29/94* (2006.01)

(52) U.S. Cl. .................. 257/493; 257/336; 257/402

(58) Field of Classification Search ........ 257/335–336, 257/339, 344, 355, 218, 220, 221, 328, 402, 257/491–493
See application file for complete search history.

(56) References Cited

U.S. PATENT DOCUMENTS

| | | | | |
|---|---|---|---|---|
| 4,682,405 A | * | 7/1987 | Blanchard et al. | 438/274 |
| 5,374,844 A | | 12/1994 | Moyer | |
| 5,498,892 A | * | 3/1996 | Walker et al. | 257/336 |
| 5,726,477 A | * | 3/1998 | Williams et al. | 257/402 |
| 5,770,880 A | * | 6/1998 | Woodbury et al. | 257/336 |
| 5,926,714 A | * | 7/1999 | Gardner et al. | 438/303 |
| 6,013,942 A | | 1/2000 | Soderbarg et al. | |
| 6,064,109 A | | 5/2000 | Blanchard et al. | |
| 6,144,070 A | * | 11/2000 | Devore et al. | 257/343 |
| 6,225,649 B1 | | 5/2001 | Minato | |
| 6,400,002 B1 | * | 6/2002 | Wu et al. | 257/607 |
| 6,437,419 B1 | | 8/2002 | Bhalla et al. | |
| 6,489,203 B1 | * | 12/2002 | Cai et al. | 438/268 |
| 6,911,696 B1 | * | 6/2005 | Denison | 257/343 |
| 2002/0036328 A1 | * | 3/2002 | Richards et al. | 257/401 |

OTHER PUBLICATIONS

S. Wolf and R.N. Tauber, "Silicon Processing for the VLSI Era", vol. 1—Process Technology, Second Edition, Lattice Press Sunset Beach, CA (2000) (pp. 371-377).*
S. Wolf, "Silicon Processing for the VLSI Era"—vol. 2: Process Intergation, sections 9.2.2 and 9.2.3, pp. 658-669.*

* cited by examiner

*Primary Examiner*—Nathan J. Flynn
*Assistant Examiner*—Johannes Mondt
(74) *Attorney, Agent, or Firm*—Bever, Hoffman & Harms, LLP; Patrick T. Bever (57) ABSTRACT

A transistor is formed with a source ballast resistor that regulates channel current. In an LDMOS transistor embodiment, the source ballast resistance may be formed using a high sheet resistance diffusion self aligned to the polysilicon gate, and/or by extending a depletion implant from under the polysilicon gate toward the source region. The teachings herein may be used to form effective ballast resistors for source and/or drain regions, and may be used in many types of transistors, including lateral and vertical transistors operating in a depletion or an enhancement mode, and BJT devices.

5 Claims, 6 Drawing Sheets

BALLAST RESISTORS FOR TRANSISTOR DEVICES

BACKGROUND OF THE INVENTION

1. Technical Field

The disclosure relates to integrated circuits, and in particular to transistors of integrated circuits.

2. Discussion of the Related Art

Figure 1:
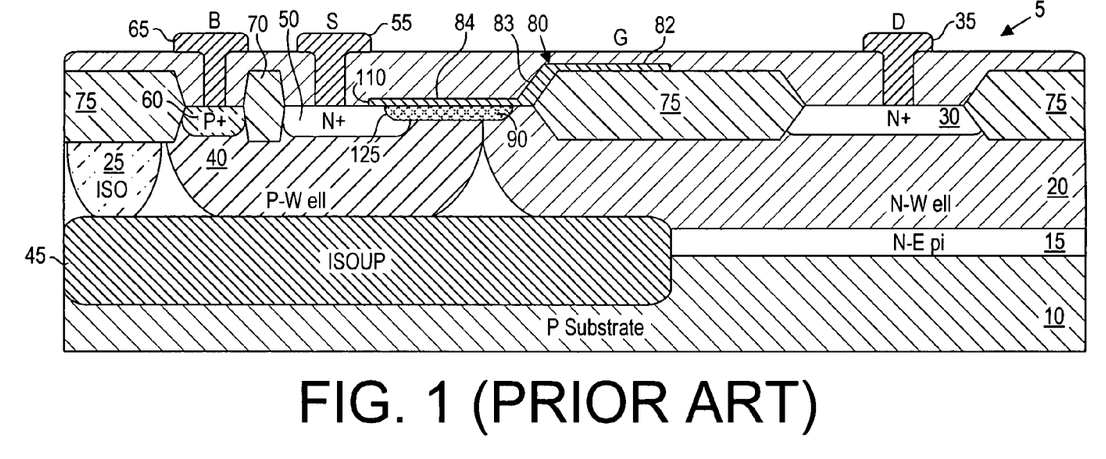
FIG. 1 is a cross-sectional side view of a prior art LDMOS transistor device.

FIG. 1 shows a conventional depletion mode Lateral Double-diffused Metal-Oxide Semiconductor (LDMOS) transistor 5 that is fabricated on a silicon substrate 10. Substrate 10 is doped with a dopant of a first conductivity type, here a P-type dopant. An epitaxial layer 15 doped with a dopant of a second conductivity type, here an N-type dopant, is grown over substrate 10. A well 20 of the second conductivity type and a body region 40 of the first conductivity type are formed in epitaxial layer 15.

A drain region 30, also of the second conductivity type, is formed in well 20 and is in contact with a drain electrode 35. Drain region 30 is doped with a higher concentration of the dopant of the second conductivity type that well 20.

A source region 50 is formed within and abuts body region 40. Like drain region 30, source region 50 is heavily doped with the dopant of the second conductivity type. Source region 50 is electrically coupled to a source electrode 55.

Also formed within body region 40 is a body contact region 60 of the first conductivity type. Body contact region 60 is more heavily doped with the dopant of the first conductivity type than body region 40. Body contract region 60 is in electrical contact with body electrode 65. Source region 50 and body contact region 60 are isolated from each other by oxide 70.

A gate electrode 80 has a first portion 82 that overlies a field oxide 75, an inclined intermediate portion 83 that overlies an inclined beaked portion of field oxide 75, and a second portion 84 that overlies well region 20, an implant region 90, and source region 50. An insulative gate oxide layer isolates gate electrode 80 from underlying layers.

Implant region 90 is a depletion implant for LDMOS transistor 5. Implant region 90 is of the second conductivity type, and is contiguously formed in a channel region of the transistor within well 20, body region 40 and source region 50. Implant region 90 couples well 20 to source region 50 across body region 40. In terms of layout, a portion of second portion 84 of gate 80 overlies implant region 90. Another portion of second portion 84, including peripheral edge 110, extends past the distal edge 125 of implant region 90 in a direction toward source electrode 55. Implant region 90 does not extend beyond the perimeter of gate electrode 80.

A buried layer 45 of the first conductivity type can be added to LDMOS transistor 5 in order to relieve high electric fields at the junctions of well 20 and body region 40. An isolation region 25 isolates the numerous transistors that may be formed on substrate 10 from each other.

Unfortunately, LDMOS transistor 5 has some shortcomings in the areas of reliability and ruggedness. For instance, as the voltage at the drain increases, the gate bias voltage required to turn-on the transistor decreases due to leakage. This reduction in the gate bias voltage can cause erroneous turn-on of LDMOS transistor 5, which could result in damage to downstream devices.

In addition, in the event of an electrostatic discharge (ESD), a large voltage can be imparted to LDMOS transistor 5. This poses a particular problem for LDMOS transistor 5, because a low breakdown voltage is inherent at the junction between source region 50 and body region 40. Hence, an ESD event can easily cause degradation of this junction.

Accordingly, a more reliable and rugged transistor structure is desirable.

SUMMARY OF THE DISCLOSURE

Our inventions allow for the fabrication of transistors with improved reliability and ruggedness, among other features. In an exemplary embodiment, a depletion mode LDMOS transistor with a source ballast resistance is provided. The source ballast resistance may be formed using a high sheet resistance diffusion self aligned to the polysilicon gate, and/or by extending the depletion implant from under the polysilicon gate toward the source diffusion. This integrated ballast resistor regulates the increase in channel current due to the reduction of threshold voltage with increasing drain bias. In addition, the source to body junction breakdown voltage is increased, which provides additional voltage margin to design ESD clamps on the source terminal when the transistor is used as a pass element.

The teachings herein may be used to form effective ballast resistors for source and/or drain regions, and may be used in many types of transistors, including lateral and vertical transistors operating in a depletion or an enhancement mode, and BJT devices.

Further aspects of the invention will become apparent in view of the drawings and following detailed description of the exemplary embodiments.

BRIEF DESCRIPTION OF THE DRAWINGS

In the present disclosure, like objects that appear in more than one figure are provided with like reference numerals.

DETAILED DESCRIPTION

Figure 2:
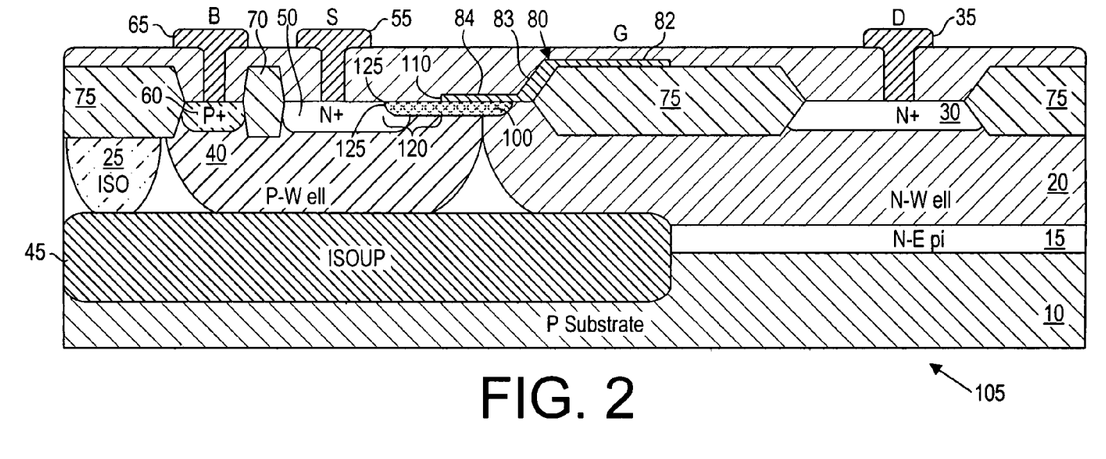
FIG. 2 is a cross-sectional side view of an exemplary embodiment of an LDMOS transistor in accordance with the present invention.

Referring to FIG. 2, an exemplary embodiment of a transistor within the present invention is illustrated. In particular, an LDMOS transistor 105 is shown, which has improved performance relative to LDMOS transistor 5 of FIG. 1. Common features of transistors 5 and 105 have the same reference numbers. While P-type semiconductor regions are referred to herein as first conductivity type regions, and N-type semiconductor regions are referred to herein as second conductivity type regions, the use of P-type and N-type semiconductor regions may be reversed. In the figures, heavily doped regions are depicted as N+ or P+, and more lightly doped regions are depicted with a N− or P−.

In one aspect, LDMOS transistor 105 achieves this improved performance compared to LDMOS transistor 5 of FIG. 1 through an extended depletion implant region 100 that functions as a source ballast resistor.

In particular, implant region 100 is of the second conductivity type, and is formed in a channel region of the transistor within well 20, body region 40 and source region 50. Implant region 100 couples well 20 to source region 50 contiguously across body region 40. Gate electrode 80 overlies implant region 100, and is isolated from implant region 100 by an intervening gate oxide layer (not shown) or some other insulative layer.

By contrast to implant region 90 of FIG. 1, implant region 100 extends beyond a perimeter of gate electrode 80. Ballast resistance is provided because an end portion 120 of implant region 100, including edge 125, extends beyond edge 110 of gate electrode 80 and terminates over source region 50. On the other hand, gate electrode 80 does not extend entirely over body region 40 and does not extend to source region 50. Rather, edge 110 of gate electrode 80 terminates over a mid-portion of body region 40.

In an alternative embodiment, edge 125 of implant region 100 may extend all the way over source region 50 and contact source electrode 55.

To achieve the embodiment of FIG. 2, body region 40 is somewhat increased in size and the length of implant region 100 is made greater than the length of implant region 90 of FIG. 1. The size of gate electrode 80 is not changed. Of course, other layout methods are possible.

Implant region 100 may be disposed a distance (e.g., 100 to 300 Angstroms) below a top surface of source region 50, body region 40, and well region 20. The width (into and out of the page in FIG. 2) of implant region 100 is equal to the width of the NMOS channel region, and the doping concentration of implant region 100 may be in the order of $1e^{12}$ to $1e^{13}/cm^2$ dose. Source region 50 may be doped at a higher concentration of $5e^{15}/cm^2$ dose.

A resistance of implant region 100 is a function of its depth, width, and length (laterally in FIG. 2), and doping concentration. In particular, the greater the length of end portion 120 of implant region 100 between the edge of source region 50 and the edge 110 of gate 80 for a given channel width, the greater the ballast resistance.

Operation of LDMOS transistor 105 of FIG. 2 will now be described. When a gate voltage above the threshold voltage $V_T$ is applied to gate electrode 80, a channel is formed between drain region 30 and source region 50 within body region 40 and well region 20. As the current in the channel increases, a voltage drop across implant region 100 increases as well. The increased voltage drop across implant region 100, in turn, decreases the current in the channel. The current flow in source region 50 also is reduced by the voltage drop across implant region 100. Accordingly, by regulating current flow in the channel and in source region 50, the source ballast resistance reduces the possibility of erroneous turn-on of the transistor due to increasing drain bias. In addition, the reduction in the current flow through LDMOS transistor 105 reduces current flow to downstream devices that are provided power by LDMOS transistor 105 and therefore limits potential damage to such downstream devices during an ESD event.

A further aspect of LDMOS transistor 105 is that implant region 100 acts as a ballast resistor for a parasitic NPN transistor that is formed by well 20 (NPN transistor collector), body region 40 (NPN transistor base), and source region 50 (NPN transistor emitter). Turn-on of the parasitic NPN transistor maybe problematic during ESD events, especially where body region 40 is connected to ground, due to the damage caused by the large channel current during an ESD event.

In one embodiment, implant region 100 is self-aligned with second portion 84 of gate electrode 80.

Figure 3:
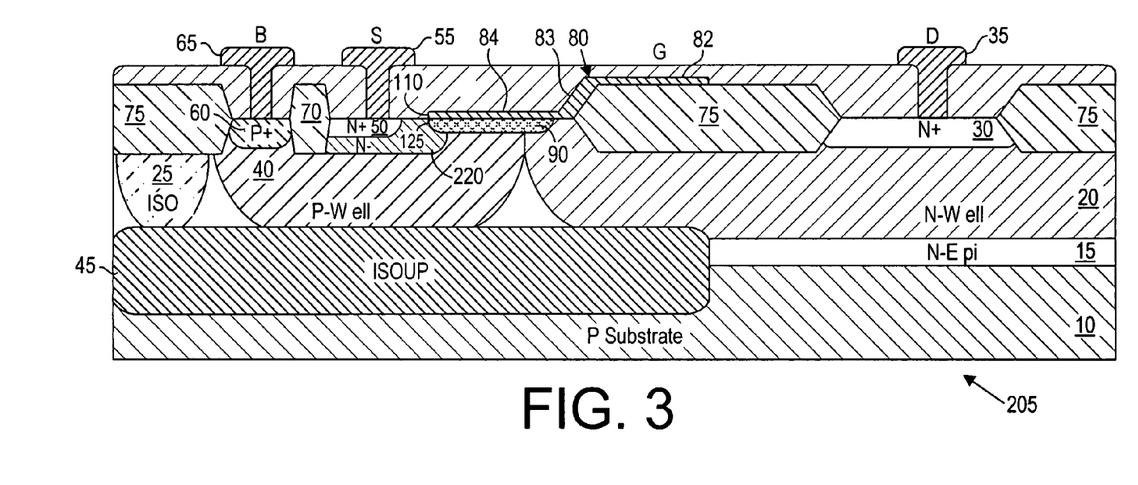
FIG. 3 is a cross-sectional side view of another exemplary embodiment of an LDMOS transistor in accordance with the present invention.

Referring to FIG. 3, another exemplary embodiment of a transistor within the present invention is illustrated. In LDMOS transistor 205 of FIG. 3, a second source region 220 is formed within body region 40, between source region 50 and body region 40. Source region 50 is formed within second source region 220. Like source region 50, second source 220 is doped to have the second conductivity type (here N-type), but with a lower doping concentration than source region 50. Second source region 220 and well 20 abut body region 40 and provide separation between body region 40 and the more heavily doped source region 50 and drain region 30, respectively.

Second source region 220 functions as a source ballast resistor. Second source region 220 regulates the increase in channel current due to the reduction of threshold voltage with increasing drain bias. The value of the ballast resistance may be adjusted, for instance, by adjusting the length of second source region 220 between source region 50 and second portion 84 of gate electrode 80, or by adjusting its dopant concentration.

LDMOS transistor 205 also has improved ruggedness in the case of an ESD event. By enclosing source region 50 in second source region 220, the source to body breakdown voltage is increased. The breakdown voltage can be tailored to exceed an expectable ESD shock to the junction. This provides additional voltage margin to design ESD clamps on the source terminal when LDMOS transistor 205 is used as a pass element, as in FIG. 5.

Practitioners will appreciate that alternative embodiments of transistors having the ballast resistance and ESD protection features of the above-described transistors are possible. For instance, in FIG. 3a, an LDMOS transistor 250 is shown that combines the implant region 100 of LDMOS transistor 105 of FIG. 2 and the second source region 220 of LDMOS transistor 205 of FIG. 3.

Figure 3A:
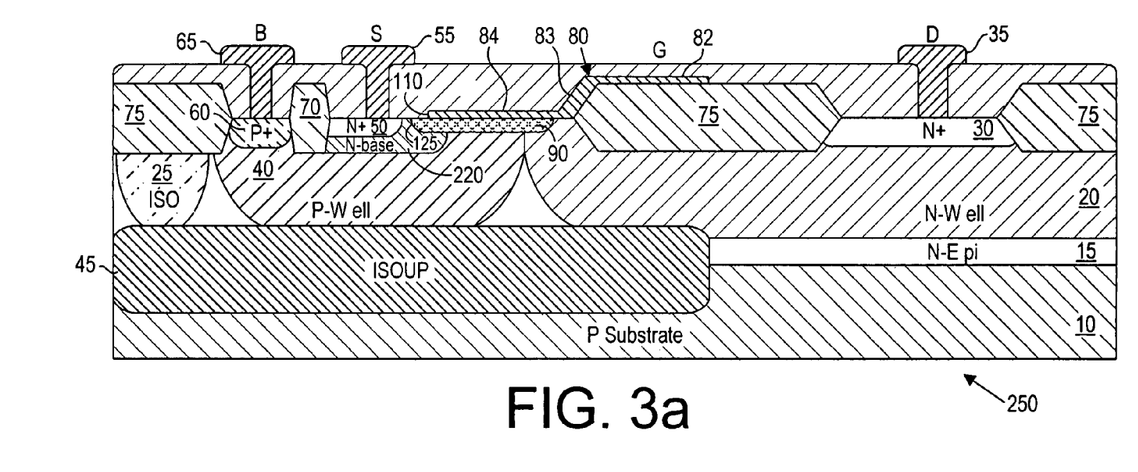
FIGS. 3a and 3b are cross-sectional side views showing other exemplary embodiments of LDMOS transistors in accordance with the present invention.

In LDMOS transistor 350 of FIG. 3a, end portion 120 of depletion implant region 100 extends contiguously through body region 40 and over second source region 220 beyond edge 110 of gate electrode 80, thereby coupling second source region 220 to well 20. Edge 125 of implant region 100 terminates over second source region 220 (i.e., does not extend to source region 50). Accordingly, in this embodiment, the source ballast resistance would be a function of both the length of second source region 220 and the length of end portion 120 of implant region 100. The source ballast resistance provided by second source region 220 and implant region 100 are in series in FIG. 3a.

Figure 3B:
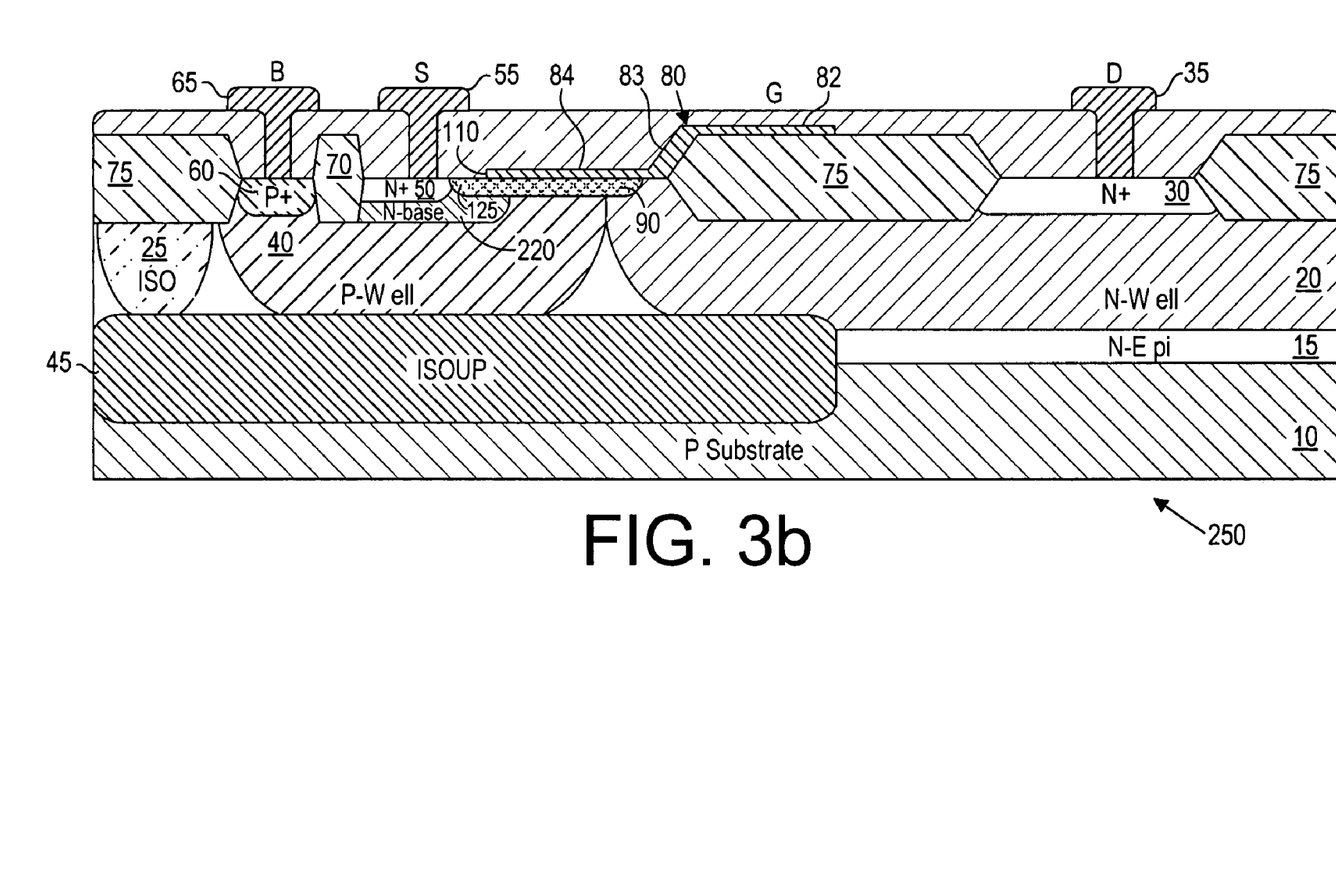

In a further alternative embodiment shown in FIG. 3b, edge 125 of implant region 100 may extends into source region 50, thereby coupling source region 50 and well 20 across body region 40 and second source region 220. In such an embodiment, the resistances provided by second source region 220 and implant region 100 are in parallel. In a further alternative embodiment, peripheral edge 110 of gate electrode 80 can terminate over body region 40, akin to FIG. 2.

Figure 4A:
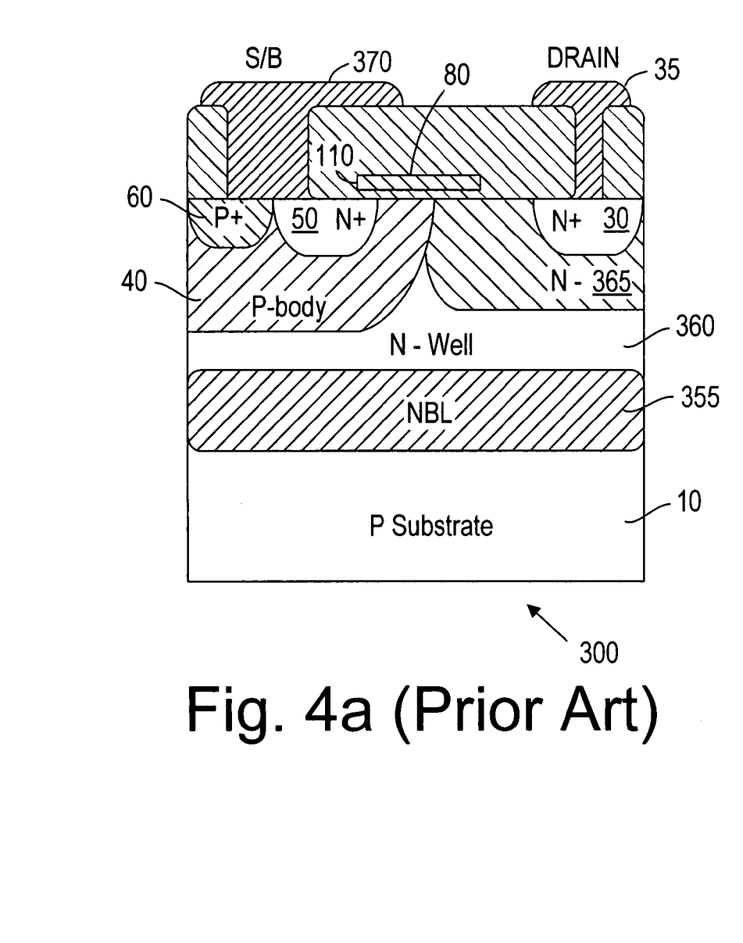
FIG. 4a is a cross-sectional side view of a prior art enhancement mode LDMOS transistor.
Figure 4B:
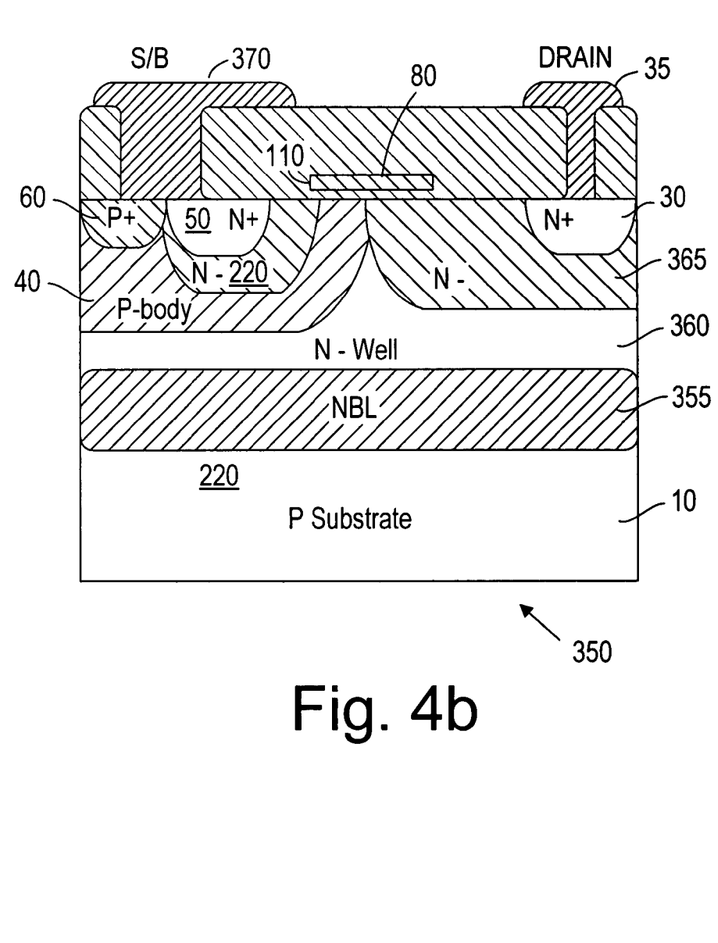
FIG. 4b is a cross-sectional side view of an exemplary embodiment of an enhancement mode LDMOS transistor in accordance with the present invention.
Figure 4C:
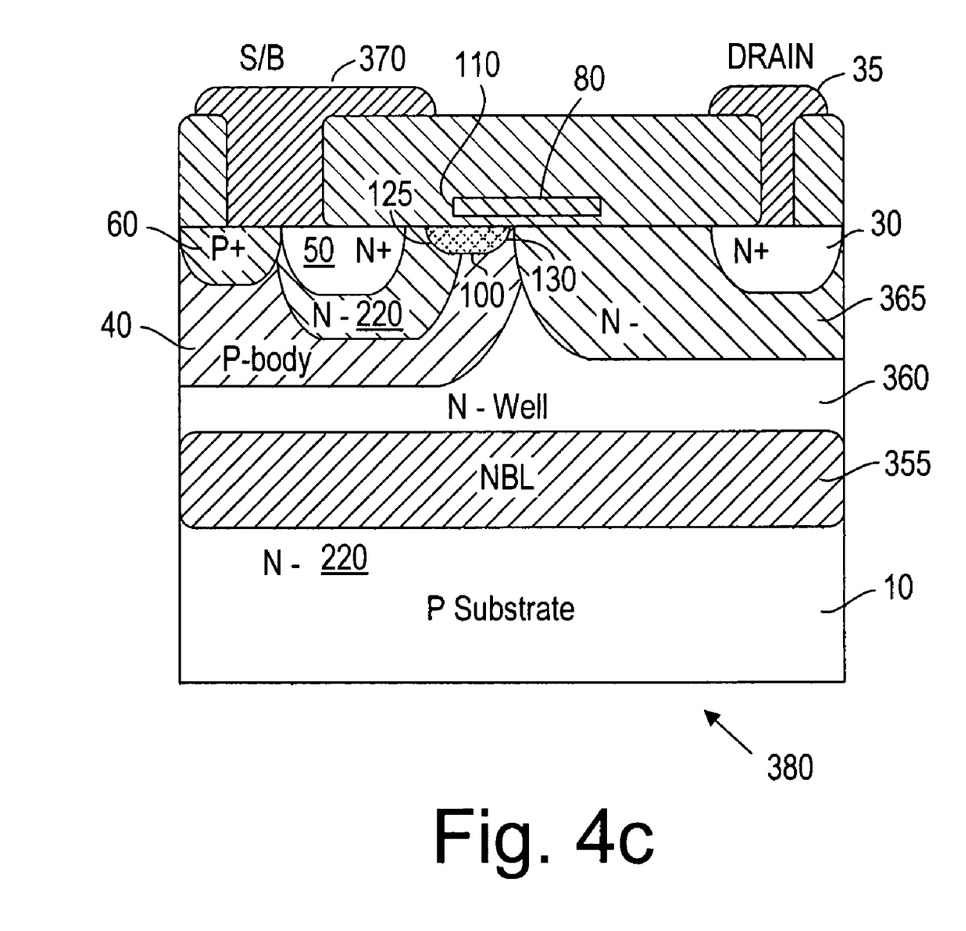
FIG. 4c is a cross-sectional side view of an exemplary embodiment of an enhancement mode LDMOS transistor in accordance with the present invention.

FIGS. 4a, 4b, and 4c illustrate other transistors of interest, and illustrate that concepts of the present invention apply to enhancement mode transistors as well as depletion mode transistors. FIG. 4a is a conventional enhancement mode LDMOS transistor 300. FIGS. 4b and 4c illustrate improved enhancement mode LDMOS transistors in accordance with the present invention.

Referring to FIG. 4a, conventional enhancement mode LDMOS transistor 300 includes a buried layer 355 and well 360, both doped to have the second conductivity type, here N-type, formed in substrate 10. Substrate 10 is doped to have the first conductivity type, here P-type. Body region 40, which is doped to have the first conductivity type, and a second drain region 365, which is doped to have the second conductivity type are formed within well 360. A highly doped drain region 30 of the second conductivity type is formed within the more lightly doped second drain region 365. Base region 60 and source region 50, which are heavily doped to have the first and second conductivity types, respectively, are formed in body region 40. A common electrode 370 is coupled to both base region 60 and source region 50. Gate electrode 80 overlies source region 50, body region 40, and second source region 365, and is isolated from these regions by an intervening oxide or other insulative layer.

Prior art LDMOS transistor 300 has reliability and ruggedness shortcomings similar to those of LDMOS transistor 5 of FIG. 1, including the risk of erroneous turn on due to a reduction in the threshold for the gate bias voltage due to increases in drain voltage, as well as the risk of a breakdown of the junction between source region 50 and body region 40 and the turn-on of parasitic transistors in the event of an electrostatic discharge.

In the embodiment of FIG. 4b, such shortcomings are resolved by providing enhancement mode DMOS transistor 350 with second source region 220 between source region 50 and body region 40. Second source region 220 is formed within body region 40, and has a lighter doping of the second conductivity type than source region 50. Source region 50 is provided within second source region 220 so that second source region 220 separates source region 50 from body region 40. Laterally, second source region 220 is between source region 50 and gate electrode 80. Gate electrode 80 overlies body region 40, and a peripheral portion of both second source region 220 and second drain region 365. Edge 110 of gate 80 terminates over second source region 220, and does not extend to source region 50. The opposite edge of gate 80 terminates over second drain region 365 and does not reach drain region 30.

Insertion of second source region 220 between source region 50 and body region 40 provides source ballast resistance, which helps to resolve the above-mentioned problem of the reduction in the threshold for the gate bias voltage. The value of the resistance is a function of the length of second source region 220 between edge 110 of gate electrode 80 and source region 50, and the doping concentration of second source region 220. In addition, insertion of second source region 220 between source region 50 and body region 40 increases the source to body breakdown voltage.

FIG. 4c shows an alternative enhancement mode lateral DMOS transistor 380 that is similar to LDMOS transistor 350 of FIG. 4b. Here, a contiguous depletion implant region 100 of the second conductivity type akin to that of FIG. 2 is formed within second source region 220 and body region 40. Gate electrode 80 overlies implant region 100 and is isolated from implant region 100 by an oxide layer. On the side of source region 50, an end portion 120 of implant region 100, including edge 125, extends beyond edge 110 of gate electrode 80. Edge 125 of implant region 100 terminates over second source region 220 in this embodiment, but alternatively can extend into source region 50. On the side of drain region 30, edge 130 of implant region 100 terminates in body region 40. Note that, because transistor 350 is an enhancement mode device, depletion implant 100 should not couple source region 50 or second source region 220 with second drain region 365, well 360 or drain region 30, or else transistor 380 would function as a depletion mode device.

In FIG. 4c, implant region 100 provides source ballast resistance in addition to the source ballast resistance provided by second source region 220. The amount of ballast resistance provided by implant region 100 is a function of the length of end portion 120 of implant region 100 beyond edge 110 of gate electrode 80, and the dopant concentration of implant region 100, as discussed above with respect to FIG. 2. The presence of implant region 100 and second source region 220 also provides for ESD protection, as discussed above. However, in an alternative embodiment, second source region 220 may be omitted.

Practitioners will appreciate that the inventions taught herein may be applied to both lateral and vertical transistors, operating in either an enhancement mode or a depletion mode.

For instance, a conventional vertical transistor has a source region (or a plurality of source regions) at a topside of the integrated circuit chip. The source region(s) is formed within a body region (or a plurality of body regions), which in turn is formed in an epitaxial layer. The source region(s) and the epitaxial layer are doped, for instance, to have a conductivity of the second type, and body region(s) is doped to have a conductivity of the first type. The source region is more heavily doped than the epixtaxial region. Underlying the epitaxial layer at an opposite bottom side of the chip is a drain region that is heavily doped to have a conductivity of the second type. A gate electrode at the top side of the chip overlies the source and body regions and a portion of the epitaxial layer. The gate electrode does not "overlie" the drain region, since the drain region is on an opposite bottom side of the chip.

An embodiment of a vertical transistor in accordance with the present invention could have an implant layer extending beyond the edge of the gate electrode and into the source region, akin to FIG. 2, with the implant layer thereby providing ballast resistance. Alternatively, in or combination with such an implant layer, a vertical transistor in accordance with the present invention could form a second source region that is lightly doped to have the conductivity of the second type. The second source region is disposed between the more heavily doped source region and the body region, akin to FIG. 3. The gate electrode would terminate over the second source region, so that the second source region would provide source ballast resistance.

Although FIGS. 2, 3, 4b, and 4c show only a single transistor, an actual transistor can be comprised of numerous transistors fabricated according to a layout that is optimized for manufacturing efficiency and device quality. Thus, where the figures illustrate a region of a single transistor, that region may be part of a patterned layer that forms the same region for numerous other transistors.

Figure 5:
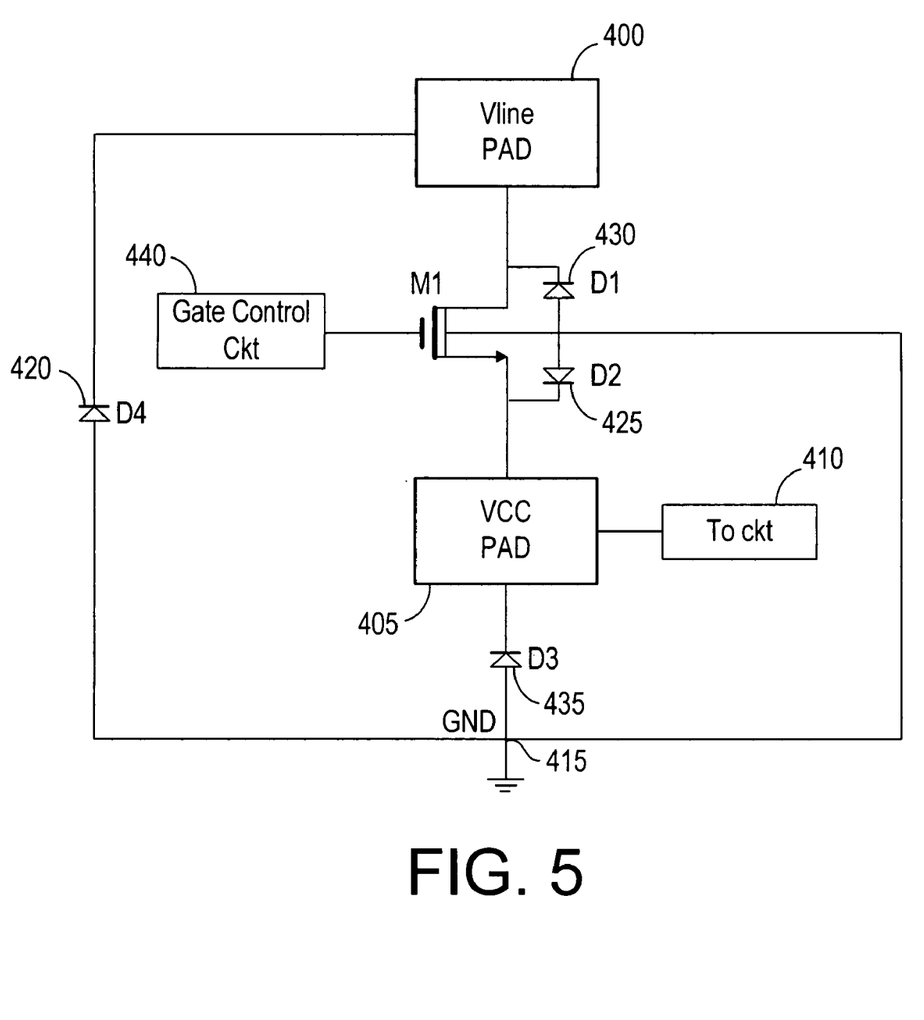
FIG. 5 is a diagram of a circuit including a transistor functioning as a pass element.

FIG. 5 shows a circuit application including a transistor M1, which may be any one of the above described transistors. The circuit in this embodiment converts a high $V_{Line}$ voltage to a logic level $V_{cc}$ voltage, although many different applications are possible.

In particular, in the circuit of FIG. 5, a high voltage pad 400 is coupled to a drain of transistor M1. A low voltage pad 405 is coupled to a source of transistor M1. A logic circuit 410, or some other circuit, is coupled to low voltage pad 405 and utilizes the power provided by operation of transistor M1. A ground potential 415 is coupled to the body of transistor M1 and to high voltage pad 400 through diode 420. Diodes 420 and 435 are provided for responding to ESD events at high voltage pad 400 and low voltage pad 405. Diodes 425 and 430 are inherent in transistor M1. Diode 430 is inherent in the drain to body junction, and diode 425 is inherent in the source to body junction.

A gate control circuit 440 is provided to control conduction by transistor M1 in order to supply the appropriate amount of power to logic circuit 410.

Where transistor M1 is a conventional transistor, e.g., LDMOS transistor 5 of FIG. 1, the transistor is susceptible to erroneous turn on due to drain induced barrier lowering as discussed above. Further, during ESD events, a parasitic NPN transistor that is formed by well 20 (NPN transistor collector), body region 40 (NPN transistor base), and source region 50 (NPN transistor emitter) can potentially turn on and conduct current between $V_{Line}$ pad 400 and $V_{cc}$ pad 405. Turn-on of the parasitic NPN transistor can be problematic during ESD events, especially where body region 40 is connected to ground.

Where transistor M1 is a transistor in accordance with the present invention, however, e.g., transistors 105, 205, 250, 350, or 380, the channel current is regulated by a voltage drop across a source ballast resistor integrated into the source region. This voltage drop across the source region reduces the gate to source voltage and thus regulates the logic level $V_{cc}$ voltage at pad 405. In addition, during ESD events on $V_{Line}$ pad 400, the source ballast resistance helps to ballast the above-mentioned parasitic transistor.

In addition, where a lightly doped source implant, e.g., second source region 220, is provided between the source region 50 and the body region 40, as in transistors 205, 250, 350, and 380, further ESD protection is obtained. For instance, during an ESD event on $V_{Line}$ pad 400, the source voltage rises, but because of the higher source to body breakdown voltage provided by the addition of second source region 220, diode 425 can have a higher breakdown voltage than diode 435, so that any ESD current can be sunk to ground through diode 435.

The detailed description provided above is merely illustrative, and is not intended to be limiting. While exemplary embodiments, applications and features of the present inventions have been depicted and described, there are other embodiments, applications and features may be developed in view of the present disclosure.

What is claimed is:

1. A transistor comprising:
   a substrate having first, second, and third regions, wherein the second region includes a dopant of a first conductivity type, the first and third regions include a dopant of a second conductivity type, with at least a first subportion of the first region and a first subportion of the third region including a high concentration of the dopant, and the second region is disposed between the first and third regions and forms a body of the transistor;
   a gate electrode overlying the second and third regions, without overlying at least said first subportion of the first region; and
   an implant region of the second conductivity type and formed within and contiguously coupling the first, second, and third regions, and beneath the gate electrode,
   wherein a portion of the implant region extends beyond an edge of the gate electrode toward said first subportion of the first region having the high dopant concentration,
   wherein the first subportion of the first region is formed within a second subportion of the first region, the second subportion of the first region has a lower concentration of the dopant of the second conductivity type than the first subportion of the first region, the second subportion of the first region is between the first subportion thereof and the second region, the gate electrode overlies the second subportion of the first region, and a portion of the implant region is formed at least in the second subportion of the first region, and
   wherein the implant region extends across the second subportion of the first region and into the first subportion of the first region.

2. A transistor comprising:
   a substrate having first, second, and third regions, wherein the second region includes a dopant of a first conductivity type, the first and third regions include a dopant of a second conductivity type, with at least a first subportion of the first region and a first subportion of the third region including a high concentration of the dopant, and the second region is disposed between the first and third regions and forms a body of the transistor;
   a gate electrode overlying the second and third regions, without overlying at least said first subportion of the first region; and
   an implant region of the second conductivity type and formed within and contiguously coupling the first, second, and third regions, and beneath the gate electrode,
   wherein a portion of the implant region extends beyond an edge of the gate electrode toward said subportion of the first region having the high dopant concentration,
   wherein the first subportion of the first region is formed within a second subportion of the first region, the second subportion of the first region has a lower concentration of the dopant of the second conductivity type than the first subportion of the first region, the second subportion of the first region is between the first subportion thereof and the second region, the gate electrode overlies the second subportion of the first region, and a portion of the implant region is formed at least in the second subportion of the first region, and
   wherein the implant region terminates within the second subportion of the first region and does not extend to the first subportion of the first region.

3. A transistor comprising:
   a substrate having first, second, and third regions, wherein the second region includes a dopant of a first conductivity type, the first and third regions include a dopant of a second conductivity type, the first and third regions include a first subportion having a high concentration of the dopant of the second conductivity type and a second subportion having a lower concentration of the dopant of the second conductivity type, and the second region is disposed between the first and third regions and forms a body of the transistor, with the second subportions of the first and third regions being between the respective first subportion thereof and the second region;

a gate electrode overlying the second region, the second subportion of the first region, and the second subportion of the third region, without overlying the respective first subportion of the first and third regions, and an implant region of the second conductivity type formed within and contiguously connecting the first, second, and third regions, wherein the implant region is located beneath the gate electrode without extending beyond a perimeter of the gate electrode.

4. A transistor comprising:

a substrate having first, second, and third regions, wherein the second region includes a dopant of a first conductivity type, the first and third regions include a dopant of a second conductivity type, the first and third regions include a first subportion having a high concentration of the dopant of the second conductivity type and a second subportion having a lower concentration of the dopant of the second type, and the second region is disposed between the first and third regions and forms a body of the transistor, with the second subportions of the first and third regions being between the respective first subportion thereof and the second region;

a gate electrode overlying the second region, the second subportion of the first region, and the second subportion of the third region, without overlying the respective first subportion of the first and third regions, and an implant region of the second conductivity type formed within and contiguously connecting the first, second, and third regions, wherein the implant region extends beyond an edge of the gate electrode in the second subportion of the first region toward the first subportion of the first region, and wherein the implant region extends into the first subportion of the first region.

5. A transistor comprising:

a substrate having first, second, and third regions, wherein the second region includes a dopant of a first conductivity type, the first and third regions include a dopant of a second conductivity type, the first and third regions include a first subportion having a high concentration of the dopant of the second conductivity type and a second subportion having a lower concentration of the dopant of the second conductivity type, and the second region is disposed between the first and third regions and forms a body of the transistor, with the second subportions of the first and third regions being between the first subportions thereof and the second region;

a gate electrode overlying the second region, the second subportion of the first region, and the second subportion of the third region, said gate electrode terminating outward of the respective first subportion of the first and third regions; and an implant region having the second conductivity type formed within and contiguously coupling the respective second subportion of the first and third regions and the second region, beneath the gate electrode, wherein a portion of the implant region extends beyond an edge of the gate electrode toward the first subportion of the first region, wherein the implant region extends into the first subportion of the first region.

* * * * *